United States Patent [19]

Hashimoto et al.

[11] 4,051,461
[45] Sept. 27, 1977

[54] MANAGEMENT TABLE APPARATUS IN MEMORY HIERARCHY SYSTEM

[75] Inventors: Masahiro Hashimoto, Sagamihara; Kenichi Furumaya, Hadano, both of Japan

[73] Assignee: Hitachi, Ltd., Japan

[21] Appl. No.: 680,851

[22] Filed: Apr. 27, 1976

[30] Foreign Application Priority Data

Apr. 30, 1975  Japan .................................. 50-51374

[51] Int. Cl.² .................. G06F 11/06; G06F 11/10; G06F 13/00
[52] U.S. Cl. .................. 364/900; 340/173 BB; 235/312
[58] Field of Search ............ 340/172 S, 146.1 F, 340/173 BB; 235/153 AM

[56] References Cited

U.S. PATENT DOCUMENTS

| | | | |
|---|---|---|---|
| 3,434,116 | 3/1969 | Anacker | 235/153 AM |
| 3,633,175 | 1/1972 | Harper | 340/172.5 |
| 3,934,227 | 1/1976 | Worst | 340/172.5 |

*Primary Examiner*—James D. Thomas
*Attorney, Agent, or Firm*—Craig & Antonelli

[57] ABSTRACT

In a memory hierarchy system comprising a main memory for storing data and a buffer memory for holding a part of the data stored in the main memory as a copy of the main memory data, the data on the buffer memory is frequently replaced by the data on the main memory so as to hold in the buffer memory the data which is very frequently used. The buffer memory also holds the data which is in an area of the main memory where an irremediable fault occurred and that data is prevented from being replaced. Therefore, the buffer memory is substituted for the fault area of the main memory so that a fail soft system is attained.

3 Claims, 8 Drawing Figures

MANAGEMENT TABLE APPARATUS IN MEMORY HIERARCHY SYSTEM

BACKGROUND OF THE INVENTION

1. FIELD OF THE INVENTION

The present invention relates to a memory hierarchy system and more particularly to a management table device in said memory hierarchy system, which when an irremediable fault has occurred in an area of the main memory, causes the buffer memory to be substituted for the invalid area of the main memory.

2. DESCRIPTION OF THE PRIOR ART

The capacity and the mounting density of the memory, especially the main memory used in a data processing system are now increasing rapidly with the demand for processing more and more amount of programs and data and with the progress in the technique of producing semiconductor memories. The improvements in the capacity and mounting density add indeed to the data processing capacity of the data processing system, but are necessarily accompanied by the increase in the number of parts used and therefore the degradation of reliability. Accordingly, in view of the significance of the memory in the data processing system, the improvement of reliability has been effected by the use of means having the capability of correcting errors by employing error-correcting codes.

The error-correcting code consists of useful information and redundant information added thereto. The detection and the correction of the failure of a certain number of bits can be performed by checking the redundant information. In most current data processing systems the error of a single bit can be remedied and the error of two bits can be detected by using such an error-correcting code. Although a data processing system can possess a capability for correcting an error consisting of more than one bit by increasing the number of redundant bits, the provision of such a capability is not desirable from the economical point of view since in that case more memory elements have to be used.

In case where an irremediable fault has taken place in the main memory, the usual measures taken are to prohibit a certain area in the main memory including the fault from being accessed by means of software or to eliminate the fault by stopping the data processing system.

In the running of a data processing system, it is not preferable to stop the system even if there is an irremediable fault in the main memory and a fail soft system having a mechanism for separating a part of the data processing system is in strong demand.

In this respect, it is preferable to prohibit a certain area in the main memory including the irremediable fault from being accessed. However, this artifice renders a relatively large area of the main memory, including the fault, useless so that the effective memory area is reduced.

Moreover, fail-soft memory means each of which is provided with an auxiliary memory or an auxiliary memory area defined in itself and with the auxiliary memory or area being substituted for the area of the main memory where a fault is existing, have been proposed by, for example, W. J. Duda et al; U.S. Pat. No. 3,588,830, patented June 28, 1971, "SYSTEM FOR USING A MEMORY HAVING IRREMEDIABLE BAD BITS" and S. D. Harper; U.S. Pat. No. 3,633,175, patented Jan. 4, 1972, "DEFECT-TOLERANT DIGITAL MEMORY SYSTEM".

However, there has not been proposed an effective, fault-free memory system which takes into consideration the organization of memory hierarchy such that a frequently used part of the data on the main memory is held as a copy for rapid access in the buffer memory having a small capacity but operating at high speed.

SUMMARY OF THE INVENTION

One object of the present invention is to provide a management table device for realizing a fail-soft memory hierarchy system.

Another object of the present invention is to provide a management table device for substituting the buffer memory for the part of the main memory where an irremediable fault has been caused.

According to the present invention, there is provided a management table which has memory locations corresponding respectively to the plural memory areas of the buffer memory BM. In the respective memory location of this management table are held the addresses of the data registered in the corresponding memory areas of the buffer memory BM and the flags to indicate whether or not the associated data is to be replaced. Whether or not the data having an address called for by an accessing device, e.g. processor, exists in the buffer memory BM, is checked by searching the management table with a searching means. If the required data is in the buffer memory, the data can be swiftly read out of the buffer memory BM. On the other hand, if the required data is not present in the buffer memory BM, then the content of certain memory location in the management table selected in accordance with a certain rule is purged, the address of the required data is registered in that memory location and the data having the required address is transferred from the main memory to the buffer memory in order to be used at high speed. This means the replacement of the old content by a new one.

However, if a flag indicating the prohibition of replacement is held in a memory location in the management table selected for the replacement of the content, the replacement of content is prohibited. Accordingly, the data prohibited from being replaced can remain continuously on the buffer memory. Thus, by holding the data stored in the local area of the main memory MM where an irremediable fault took place, in the buffer memory BM and by providing the held data with a flag for indicating the prohibition of replacement, the buffer memory can be substituted for a part of the main memory.

With the configuration described above, there will be a case where no replaceable data is found in the memory locations in the management table. Such a condition occurs where all the contents to be replaced are provided with the flags of prohibition or where the replacement of contents in the memory locations of the management table is prohibited by a specific procedure which is independent of the above described flags of prohibition and separately determined according to a particular logic. In that case, the required data cannot be transferred from the main memory to the buffer memory. According to the present invention, the required data can be transferred directly from the main memory to the processor which is in need of the data in the case where there is no replaceable data in the management table.

The present invention enables the buffer memory to be substituted for the main memory in which faults have occurred, while making the best use of the feature of the memory hierarchy constitution.

DESCRIPTION OF THE PREFERRED EMBODIMENTS

Figure 1:
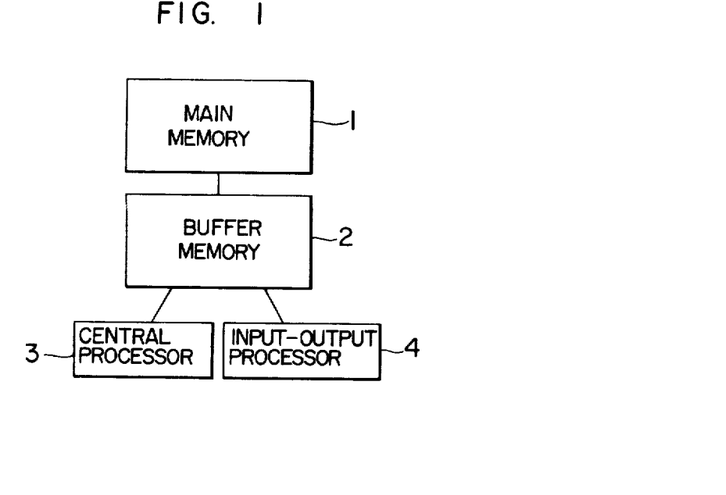
FIG. 1 shows in block diagram a memory hierarchy system as a whole.

In FIG. 1, a reference numeral 1 indicates a main memory, 2 a buffer memory, 3 a central processor, and 4 an I/O (input-output) processor. The buffer memory 2 has a smaller capacity than the main memory 1, but is constituted of memory elements capable of operating at much higher speeds to diminish the memory access time and to improve the memory throughput, of the memory hierarchy system. In the buffer memory 2 is provided a table which shows the correspondences between the addresses of the main memory and the addresses of the buffer memory and the delivery and receiving of data is performed by converting the addresses required by the central and I/O processors 3 and 4 into the corresponding addresses in the buffer memory 2. In an ordinary data processing system, the data transfer between the I/O processor and the main memory is directly performed, but in this invention the data transfer between the I/O processor and the main memory must be performed only through the buffer memory.

The structure of the management table provided in the buffer memory 2 permits various modifications thereof and there are a number of algorithms for registering and substituting a copy of the content of the main memory into the buffer memory. Only one example will be described in this specification for the sake of simplicity.

It is assumed in the following description that the management table has n columns and two rows. In that case, the buffer memory is divided into 2n blocks each of which usually consists of several ten bytes and makes a one-to-one correspondence to each of the 2n entries in the management table.

Figure 2:
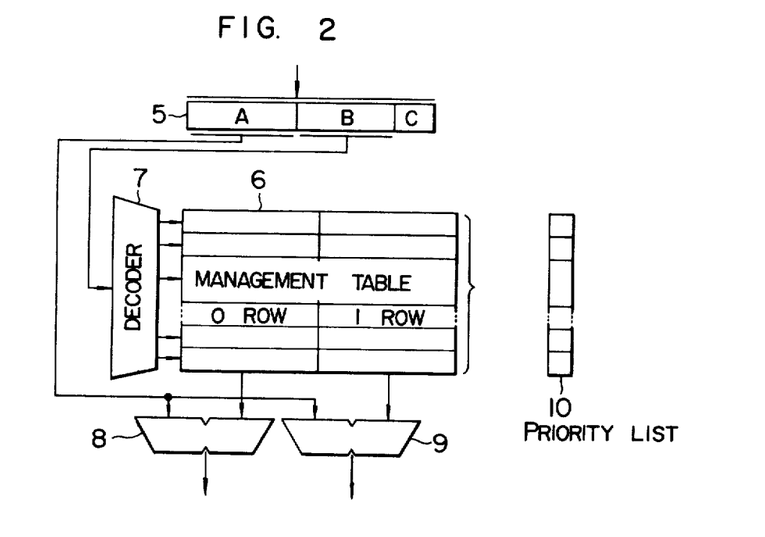
FIG. 2 schematically shows a management table for the system shown in FIG. 1.

The control of accessing the buffer memory will be described with the aid of FIG. 2. In FIG. 2, a memory address register 5 holds an address in the main memory 1. The management table in the buffer memory 2, having n columns and two rows (row 0 and row 1), is indicated by a reference numeral 6. By reference numerals 7, 8, 9 and 10 are indicated respectively a decoder for selecting at a time a column of the table 6, a comparator for the row 0, a comparator for the row 1, and a priority list.

The accessing of the buffer memory 2 begins with the searching of the management table 6 by the memory address register 5. The content of the memory address register 5 consists of an address-in-block C which corresponds to the dimension of the single block of the buffer memory 2 having 2n blocks, a column selection address B sent to the decoder 7 to select one of the columns of the table 6 and a comparison address A sent to the comparator 8 and 9 to determine whether or not the data corresponding to the address is in the buffer memory 2. The column selection address B of the memory address register 5 is sent to a decoder 7 so that the two entries in one of n columns of the table 6 are selected to be sent to comparators 8 and 9. Each entry of the table 6 consists of a valid bit for indicating the validity of the corresponding block of the buffer memory 2 and the comparison address indicating the memory address of a copy of a part of the main memory registered in the block. The entries of the two rows in the column selected according to the column address B of the memory address register 5 are read and sent to the comparators 8 and 9 to be compared with the comparison address A of the memory address register 5. When there is a coincidence in the comparator 8 or 9 and when the valid bit of the coincident entry is "1", the data specified by the memory address register 5 exists in the buffer memory 2. The selection of addresses in the buffer memory 2 is performed as follows. First, a block address in the buffer memory 2 is known according to the number of the column of the table 6 which shows the coincidence, namely a column address B in the memory address register 5, and to the number of the row which shows the coincidence, and then the address in the block is determined according to an address-in-block C in the memory address register 5.

When none of the comparators 8 and 9 find a coincidence, data including the specified memory address is transferred from the main memory to one of the two blocks of the buffer memory corresponding to the selected column, the comparison address of the corresponding entry of the tble is replaced by the comparison address A of the specified memory address register 5 and the associated valid bit is set to be "1". The replacement of an entry takes place preferentially in the entry with a valid bit "0", but if there is not any entry with valid bit "0" in a column, the replacement of entry takes place in one of the two rows of the column according to a predetermined rule. One of the widely used algorithm of replacement is the LRU (Least Recently used) method and according to this method the lest recently used entry is preferentially subjected to replacement. In the embodiment shown in FIG. 2, a priority list 10 is prepared for the respective columns of the table 5. If the row 0 of a column is referred to, the bit "1" is set in the corresponding column and if the row 1 of the same column is referred, the bit "0" is set in the same location. Thus, the history of reference to the two entries can be known. The foregoing is the description of how the buffer memory is controlled.

The present invention provides a means for prohibiting the replacement of the contents of specific blocks of the buffer memory under instruction of a program, e.g. micro programming. If in case of an irremediable fault having occurred in an area on the main memory certain blocks of the buffer memory are substituted for the fault area of the main memory according to such a program and if the contents of the substituting blocks of the buffer memory are prohibited from being replaced, then the decrease in the effective memory region of the main memory due to the fault can be prevented and a fail-soft operation can be obtained. Although in this case the contents of some blocks of the buffer memory are fixed, no considerable reduction in performance will be incurred at an ordinary error-generating probability. Since the prohibition of the replacement of contents of the blocks of the buffer memory is determined after the outbreak of an irremediable fault, the data cannot be transferred ordinarily from the main memory to the blocks of the buffer memory substituted for the fault area of the main memory. The data transfer to the substituting blocks must be performed directly from other main memory blocks or input-output device by a suitable program. In the prior art system, a considerably large area in the main memory which includes the fault area is usually prohibited from being used under the control of the software. According to the present invention, the effective capacity of the memory area of the main memory is by no means decreased. Moreover, according to the present invention, once the replacement of the blocks corresponding to the fault area of the main memory is prohibited, the software can cause the program to proceed, irrespective of how the useless area is to be treated, except in case where the prehibition of replacement is again demanded due to another fault having occurred in the main memory.

Figure 3:
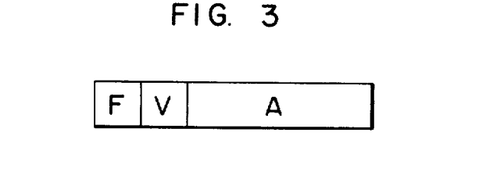
FIG. 3 shows the format of an entry of the management table.

FIG. 3 shows an example of a format of one entry of the management table 6 according to the embodiment of the present invention. In the format shown in FIG. 3, the comparison address of a memory address is indicated at a reference character A and the comparison address A is compared with the comparison address A in the memory address register 5 by the comparators 8 and 9. A valid bit is indicated at V and when the valid bit of an entry is "1", the data in the block of the buffer memory corresponding to the entry is valid. The character F refers to a fixed bit which is introduced in this invention. If the fixed bit F of an entry is "1", the command of replacing the content of the block of the buffer memory corresponding to the entry is neglected.

When an irremediable fault has occurred in the main memory, the program specifies memory addresses and the associated row numbers and instructs to set "1" in the selected fixed bits F. At the same time, a column of the table is selected according to the column address B in the memory address register 5 and the F and V bits of the entry of the row selected according to the row number sent through another information line are both set to be "1" and the comparison address A of the memory address is stored in the part A of the entry shown in FIG. 3.

It is preferable that the program should have a function of not only setting "1" in the F bit, but setting "0" in the F bit. Such a function is useful as a means for collecting detailed fault information in case of fault according to a diagnostic program. It is, however, apparent that the set and reset of the F bits can be performed directly by the hardware, not by means of program.

Figure 4:
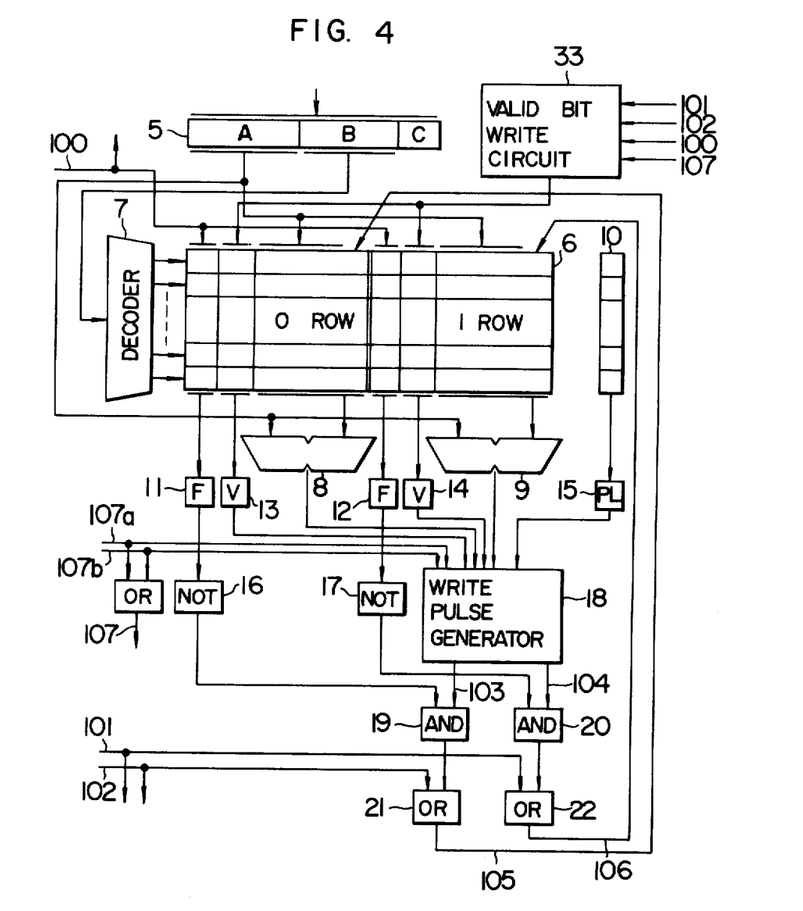
FIG. 4 is a block diagram of a memory hierarchy system as an embodiment of the present invention.

The embodiment of the present invention will be described in further detail with the aid of FIGS. 4 to 8. In FIG. 4, reference numerals 5 to 10 are applied to the same parts as in FIG. 2. An F latch 11 holds the F bit of an entry read out of the row O of the management table 6 and F latch 12 holds the F bit of an entry read out of the row 1 of the table 6. V latches 13 and 14 hold the V bits of the entries of the corresponding rows of the table 6. A PL latch 15 holds the content of the priority list 10 corresponding to the selected column. A write pulse generator 18 generates a write pulse sent to the table when the entry of the table is replaced or canceled (i.e. the valid bit is changed to "0").

In the operation of memory reference, the management table 6 is searched by the memory address register 5 as in the circuit shown in FIG. 2. The replacement of the entries of the management table takes place in the cases 1. where since there is no entry in the table coincident with the content of the memory address register 5, new data corresponding to the content of the register must be transferred from the main memory to the buffer memory, 2. where such errors as parity errors are caused in the blocks of the buffer memory so that the erroneous contents must be cancelled, and 3. where the F bits must be rewritten.

The write pulse generator 18 is driven by the signals from the comparators 8 and 9, the V latches 13 and 14 and the PL latch 15 and by the signals on lines 107a and 107b. The signal on each of the lines 107a and 107b is normally "0" but becomes "1" when such an extraordinary condition as a parity error occurs in the buffer memory. The write pulse generator 18 specifies the row number of the entry to be replaced according to the above mentioned inputs. The selection of the row number is performed as by using the LRU algorithm described above. The generator 18 delivers a write pulse onto a line 103 when the entry in the row 0 is to be replaced and onto a line 104 when the entry in the row 1 is to be replaced.

Figure 5:
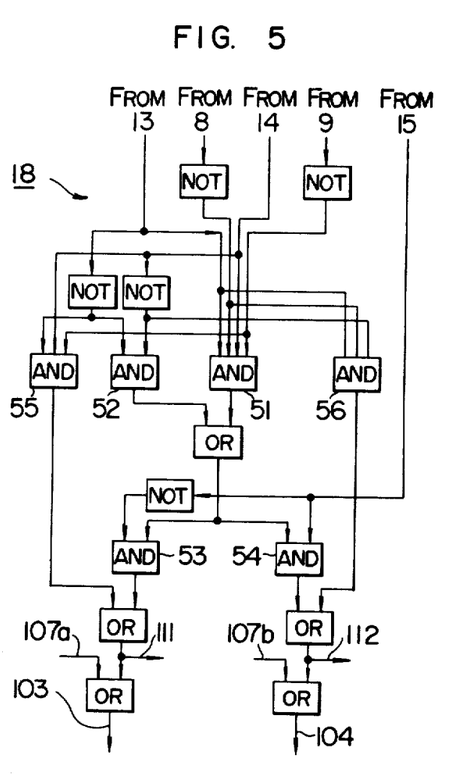
FIG. 5 shows the detail of a circuit for generating write pulses, used in the system in FIG. 4.

FIG. 5 shows a detailed structure of the write pulse generator 18. An AND circuit 51 is opened when the contents of both the V latches 13 and 14 are valid (= "1") and both the comparators 8 and 9 find no coincidence (i.e. deliver "0"), while an AND circuit 52 is opened when the contents of both the V latches 13 and 14 are invalid (= "0"). When the AND circuit 51 or 52 is opened, an AND circuit 53 or 54 is opened depending on the state of the PL latch 15 so that a write pulse is delivered onto a line 103 or 104. When the contents of the V latches 13 and 14 are respectively invalid and valid while the comparator 9 finds no coincidence, an AND circuit 55 is opened to energize the line 103 to replace an entry in the row 0. On the other hand, when the contents of the V latches 13 and 14 are respectively valid and invalid while the comparator 8 finds no coincidence, an AND circuit 56 is opened to energize the line 104 to replace an entry in the row 1. The line 107a and 107b serve to replace the entries in the rows 0 and 1, respectively. In this way, the write pulse generator 18 delivers a write pulse onto the line 103 when an entry in the row 0 is to be replaced and onto the line 104 when an entry in the row 1 is to be replaced.

Now referring back to FIG. 4, if the contents of the F latches 11 and 12 are "0", the pulses on the lines 103 and 104 appear at the outputs of AND circuits 19 and 20, respectively. The output of the AND circuit 19 and the signal on the line 102 are applied to an OR circuit 21 to make a logical sum of the inputs, and the output of the AND circuit 20 and the signal on the line 101 are applied to an OR circuit 22 to make a logical sum of the inputs. Pulses are sent through the lines 101 and 102 when the program instructs to rewrite the F bits and another control circuit not shown controls to prevent the pulses from being delivered onto the lines during the operation of memory reference. For this purpose, every memory reference is prohibited by, for examle, a memory lock means while each F bit is being rewritten.

Accordingly, the pulses on the lines 103 and 104 are respectively transmitted to the lines 105 and 106 so that the entry in the row specified for replacement and in the column selected according to the column address B of the memory address register 5 is rewritten. The comparison address A of the memory address in the memory address register 5 is written in the comparison address (A) portion of the entry, the corresponding V bit becomes "1", and the associated F bit continues to be "0". The write signal for the F bit is supplied through a line 100 which is energized only when the pulses are on both the lines 101 and 102. A signal generated according to the logical sum and the logical product, of the signals on the lines 101 and 102, is sent through the line 100 to the F bit part of the table 6 (The circuitry for effecting these conditions is not shown). In this case, therefore, the "0" in the F bit remains unchanged.

Figure 6:
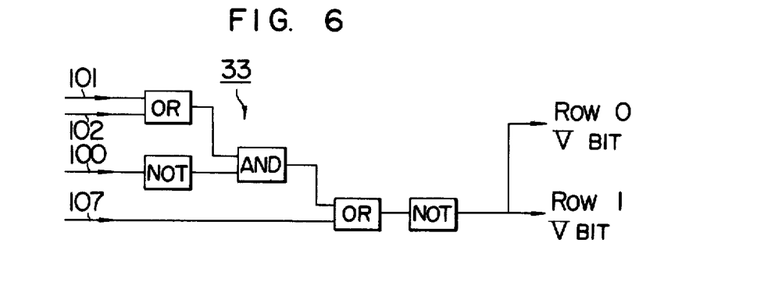
FIG. 6 shows the detail of a circuit for writing valid bits, used in the system in FIG. 4.

FIG. 6 shows the detail of a write circuit 33 in FIG. 4, which serves to write a valid bit in the valid bit part of each entry of the table 6. Through a line 107 is sent a logical sum signal of the signals on the lines 107a and 107b which drive the write pulse generator 18 when an extraordinary condition such as a parity error has taken place. Upon occurrence of an abnormal condition, the signal on the line 107 becomes "1" so that "0" is written in the V bit. In case of rewriting F bits, the write signal lines 101 and 102 connected with the decoder for decoding the program are energized and the logical circuits shown in FIG. 5 perform such a control operation that the V bit becomes "1" when "1" is written in the F bit part while the V bit becomes "0" when "0" is written in the F bit part. During the operation of replacing the entries of the management table 6, the input signals in FIG. 5 are all "0" so that all the write signals for the valid bits become "1".

When an extraordinary condition such as a parity error is caused in the buffer memory, the write pulse generator 18 is driven through the lines 107a and 107b. A pulse is delivered onto the line 103 to cancel the entries in the row 0 and onto the line 104 to cancel the entries in the row 1. In this case, the column address to be cancelled is specified by the column address B in the memory address register 5 and the column address is read out before the write pulse is generated, so that the F bit of the selected entry is set in the F latch. If the F bit of the entry selected to be cancelled is "0", the V bit of this entry becomes "0" due to the control of the logical circuits shown in FIG. 6.

In the case where the content of the F latch 11 or 12 is "1", "0" is applied to the AND circuit 19 or 20 through an inverting circuit 16 or 17 and therefore even if the write pulse generator 18 delivers pulses onto the lines 103 and 104 for the replacement or cancellation of entries, the write pulses cannot be transmitted to the lines 105 and 106.

Namely, in the management table, the entry whose F bit is "1" is prohibited from being replaced or cancelled. Even if the content of the block in the buffer memory corresponding to the entry of the table whose F bit is "0", is cancelled, the data equivalent to the cancelled content is still stored in the main memory. However, the buffer memory is substituted for the main memory, with respect to the data corresponding to the entry whose F bit is "1" so that such data is not existing in the main memory and must be prohibited from being cancelled.

The foregoing is the description of the function of the F bit in case of replacing the entries of the management table. The rewriting of F bits is controlled as follows. When a program or micro program instructs to write "0" or "1" in an F bit part, the data processing system control the following series of operations.

1. A selected memory address is sent to the buffer memory control section to specify the column address and the registered address which correspond respectively to the column address B and the comparison address A shown in FIG. 4.

2. A pulse is delivered onto the line 102 to rewrite the F bit in the row 0 and onto the line 101 to rewrite the F bit in the row 1. The pulse is transmitted to the line 105 or 106 through the OR circuit 21 or 22. When the signal "1" is on the line 100, the F bit becomes "1" while the F bit becomes "0" when the signal "0" is on the line 100. The substituted area of the main memory is specified by the comparison address A in the memory address register 5. In this case, as described above, the logical circuitry shown in FIG. 6 causes the V bit to become "1" or "0" according as the corresponding F bit is "1" or "0". It is apparent that if another line is provided for the V bits, the F bit and the V bit can be independent of each other.

The foregoing is concerned with the function of the F bit in case of replacing the entries of the table 6. When the entry in which the F bit is set is accessed, the following operations must be assured.

First, when there is a demand for the partial writing into the entry whose F bit is "1", the redetection of fault in the main memory should be prohibited. Secondly, the transfer of data from the main memory to the blocks of the buffer memory corresponding to the entries of the table whose F bits are "1", should be prohibited.

Under the first condition, i.e. in case where a data is stored in the buffer memory, the write instruction subjects the main memory to the writing operation in order that the contents of the main memory and the buffer memory may be coincident with each other. Since the blocks of the buffer memory corresponding to the entries of the management table whose F bits are "1" are substituted for the fault area on the main memory, the operation of writing in the main memory, especially partial writing operation which accompanies the reading operation, causes the re-detection of the fault in the main memory so that the normal operation of the processor is disturbed.

Figure 7:
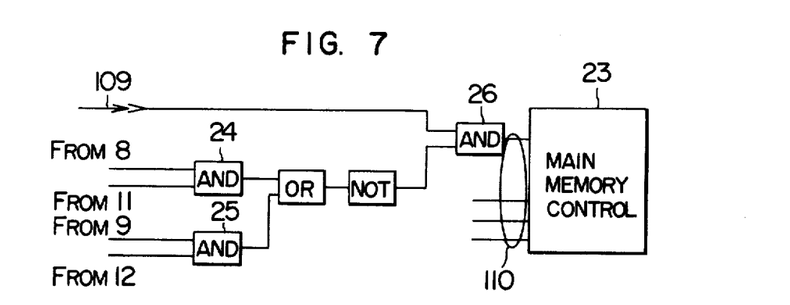
FIGS. 7 and 8 show the detail of circuits for starting the main memory, used in the system in FIG. 4.

The control operation for solving this problem will be described with the aid of FIG. 7. A main memory control 23 starts the memory operation of the main memory. The signals for the reading operation, the operation of transferring a one-block data to the buffer memory, the writing operation, the diagnostic operation etc. are applied to the main memory control 23 through a bundle of main memory driving signal lines 110. In the writing operation, the coincidence signal of the comparator 8 for the row 0 and the output signal of the F latch 11 for the row 0 are applied to the AND circuit 24 while the coincidence signal of the comparator 9 for the row 1 and the output signal of the F latch 12 for the row 1 are sent to the AND circuit 25, the outputs of the AND circuits 24 and 25 are applied through an OR circuit and a NOT circuit to an AND circuit 26 while the signal on the writing drive signal line 109 is applied to the AND circuit 26, and the output of the AND circuit 26 is applied to the main memory control 23.

When one of the AND gates 24 and 25 is opened, the memory operation of the main memory is started. In this case, however, the writing drive signal on the line 109 is prevented from reaching the main memory control 23 by the AND circuit 26 so that the fault area of the main memory is prevented from performing storing operation. When none of the AND gates 24 and 25 is opened, the writing in the entries whose bits are "0" is to be started. Accordingly, the AND gate 26 is opened to apply the writing drive signal to the main memory control 23. Thus, the writing in the entries whose F bits are "0" can be performed without any disturbance. Since the data on a certain area of the main memory corresponding to the entries of the table whose F bits are "1" is never used, a method in which the partial writing operation is always converted to the full writing operation may be proposed. No fault is detected by the full writing operation.

Under the second condition mentioned before, i.e. in case where the F bits of the entries specified to be replaced according to the instruction from the write pulse generator 18 shown in FIG. 4 are "1", the transfer of data from the main memory to the blocks of the buffer memory corresponding to these entries should be prohibited. Namely, the data read out of the main memory should be transferred not to the blocks of the buffer memory corresponding to the entries whose F bits are "1", but directly to the processor which is in need of the data.

There are known two methods devised for this purpose; one is to transfer a relevant block from the main memory to the processor and to extract the desired data from the block and the other is to transfer only the data having the required address from the main memory to the processor.

In case of the first method, the write pulse must be prevented from reaching the buffer memory by a certain means equivalent to the AND circuit 24 or 25, so that the transfer of blocks to the entries whose F bits are "1" may be prevented. The data demanded by the processor is transferred as a part of the block and only the required data is extracted from the transferred block. The operation of extracting the needed information from the transferred block is also performed in transferring data from the block of the buffer memory to the processor requiring the data, and the data specified by the memory address register is located at the beginning or end of the blocked data. According to this method, however, superfluous data is also read out of the main memory, independent of whether or not the read data is written in the buffer memory, so that the overhead bits increase to cause a drawback in practice. In this respect, the second method proves to be more effective in which only the required data is read out when the write pulse generator 18 instructs to replace the entries of the buffer memory whose F bits are "1".

Figure 8:
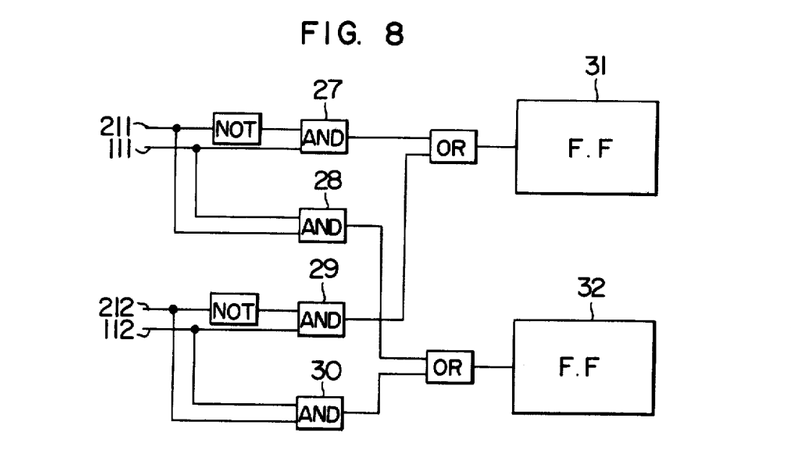

The second method mentioned above will now be described in detail with the aid of FIG. 8. In FIG. 8, the lines 211 and 222 are connected respectively with the F latches 11 and 12 for the rows 0 and 1 and the lines 111 and 112 serve to conduct the output of the write pulse generator 18, as seen in FIG. 5. Namely, the line 111 conducts a pulse to instruct the replacement of the entries in the row 0 and is connected with AND circuits 27 and 28 while the line 112 conducts a pulse to instruct the replacement of the entries in the row 1 and is connected with AND circuits 29 and 30. The signal on the line 211 which is the output of the F latch for the row 0 is sent not only to the AND circuit 27 through a NOT circuit, but also to the AND circuit 28 directly. The signal on the line 212 which is the output of the F latch for the row 1 is sent directly to the AND circuit 30 as well as to the AND circuit 29 through a NOT circuit. The outputs of the AND circuits 27 and 29 are applied to an OR circuit, the output of which is applied to a flip-flop 31 whose output demands the transfer of blocks. The outputs of the AND circuits 28 and 30 are applied to an OR circuit, the output of which is applied to a flip-flop 32 whose output demands the reading operation.

In case where the F bits are "0", that is, the outputs of the F latches for the rows 0 and 1 are both "0", when the operation of replacement is instructed to the row 0, the AND circuit 27 delivers an output "1" while when the operation of replacement is instructed to the row 1, the AND circuit 29 delivers an output "1", and at least one of the outputs "1" is sent through the OR circuit to the set terminal of the flip-flop 31. Accordingly, the flip-flop 31 delivers a signal for demanding the operation of transferring blocks from the main memory to the buffer memory. The signal delivered from the flip-flop 31 is one of the main memory drive signals applied to the main memory control 23 in FIG. 7 and resets the flip-flop 31 when the control 23 has finished the transfer of blocks.

Next, in case where the replacement of the content of the blocks of the buffer memory corresponding to the entries of the table whose F bits are "1", is instructed, when the replacement is instructed to the row 0, the AND circuit 28 delivers an output "1" while when the replacement is instructed to the row 1, the AND circuit 30 delivers an output "1". At least one of the outputs of the AND circuits 28 and 30 is sent through the OR circuit to the set terminal of the flip-flop 32 to drive the flip-flop 32 into its set state. The flip-flop 32 in turn delivers a signal to instruct the operation of reading out of the main memory only the data specified by the memory address register and the operation of transferring the required data to the processor. The signal is applied to the main memory control 23, which in turn delivers a signal to instruct the operation of reading the required data out of the main memory. When the flip-flop 32 receives a signal representing the completion of the reading operation from the main memory control 23, it is reset.

It is understood from the above description that the data read out of the main memory is by no means written in the blocks of the buffer memory corresponding to the entries of the table whose F bits are "1".

It is to be noted that there is a possibility of a case occurring where the F bits of entries belonging to the specified columns of the management table are all "1". Such a case will be caused due to too many irremediable faults in the main memory and cannot be coped with by the present invention.

If the operation for causing the F bits to become "1" is performed on the columns containing the entries whose F bits are "1", the program must be immediately informed of the operation. The information of the operation can easily be done by, for example, an ordinary interruption means. The program, having received the information, can then separate a certain area from the main memory in accordance with the control by the program. However, the chance of such a condition taking place is very rare in view of the frequency of faults occurring in the main memory so that the practice of the present invention will be by no means disturbed by such a condition.

As described above, in the embodiment of the present invention, the rows whose entries are to be replaced are selected according to the procedure independent of the indication of prohibiting the replacement of entries. However, the procedure may be related to some extent to the indication. Namely, so long as there are rows having replaceable entries, the rows may be used, and only when the entries of all the rows in the selected columns are prohibited from being replaced, the data may be transferred from the main memory directly to the processor which is in need of the data.

In the embodiment described above, description has been made of the case where when an irremediable fault has occurred in the main memory, certain blocks of the buffer memory are substituted for the fault areas of the main memory and the contents of the substituting blocks of the buffer memory are prohibited from being replaced. However, in case of a system in which the unit of the data transfer to the buffer memory is a word (consisting of several bytes and smaller than a block), it is only necessary to allot a fault word to a block of the buffer memory, to cause the F bit corresponding to the word to be "1", and to prohibit the word from being rewritten. This kind of an artifice will be easily thought of by those skilled in the art.

It is needless to say that the present invention can be applied not only to the combination of a main memory and a buffer memory, but also to that memory system having a hierarchical configuration which includes an original memory and the copy of the original memory.

We claim:

1. A management table apparatus in a memory hierarchy system having a main memory for storing data and a buffer memory consisting of plural memory regions which hold a part of the data stored in said main memory as a copy of said data, said part of data being divided into certain memory units, said management table apparatus comprising:
    a management table having memory locations corresponding to said memory regions of said buffer memory, said memory locations holding the addresses of the data in said corresponding memory regions and flags for indicating whether or not the replacement of said data stored in said corresponding memory regions is prohibited;
    a searching means for searching said table to check whether or not the data having an address which is demanded by a data processor is stored in said buffer memory by comprising said address demanded by the data processor with addresses stored in respective memory locations of said management table;
    a replace control means responsive to the indication of the absence of the demanded data by said searching means for selecting any memory location other than those in which said flags indicate the prohibition of replacement to transfer from said main memory and store in said buffer memory said data having address demanded by the data processor;
    a means for demanding the transfer of said demanded data from said main memory directly to said data processor in case where said searching means indicates the absence of said demanded data and where no memory location is selected by said replace control means; and
    means for setting said flags upon the detection of a fault in the main memory; a means for stopping the detection of faults in said main memory while the flags corresponding to the data whose existence in said buffer memory is indicated by said searching means, are showing the prohibition of replacement; and
    a means for detecting the faults whose number is greater than that of said memory locations of said management table have occurred in said main memory.

2. A management table apparatus as claimed in claim 1, further comprising a means for prohibiting the operation of writing data in said main memory when a flag in a memory location of said management table corresponding to the data whose existence in said buffer memory is indicated by said searching means, is showing the prohibition of replacement.

3. A management table apparatus as claimed in claim 1, wherein said replace control means selects the memory location of said management table whose contents are to be replaced when the non-existence of said demanded data in said buffer memory is indicated by said searching means and wherein said selection of said memory location is prohibited while the flag of said memory location is showing the prohibition of replacement.

* * * * *